(12) United States Patent
Jang et al.

(10) Patent No.: US 7,705,686 B2
(45) Date of Patent: Apr. 27, 2010

(54) INJECTION-LOCKED FREQUENCY DIVIDER

(75) Inventors: Sheng-Lyang Jang, Taipei (TW); Yun-Hsueh Chuang, Taoyuan County (TW); Shao-Hwa Lee, Taipei County (TW)

(73) Assignee: National Taiwan University of Science and Technology, Taipei (TW)

( * ) Notice: Subject to any disclaimer, the term of this patent is extended or adjusted under 35 U.S.C. 154(b) by 86 days.

(21) Appl. No.: 11/984,696

(22) Filed: Nov. 21, 2007

(65) Prior Publication Data

US 2009/0033430 A1 Feb. 5, 2009

(30) Foreign Application Priority Data

Aug. 1, 2007 (TW) ............................... 96128307 A

(51) Int. Cl.
*H03L 7/24* (2006.01)
*H03K 3/03* (2006.01)

(52) U.S. Cl. .............................. 331/57; 331/51; 331/55; 327/115; 327/118

(58) Field of Classification Search ................... 331/51, 331/55, 57; 327/115, 117, 118
See application file for complete search history.

(56) References Cited

U.S. PATENT DOCUMENTS 6,229,403 B1 * 5/2001 Sekimoto ..................... 331/57
6,683,480 B2 * 1/2004 Zhang et al. ................. 327/115
7,298,183 B2 * 11/2007 Mirzaei et al. .............. 327/115
2007/0085617 A1 * 4/2007 Salerno ....................... 331/167

OTHER PUBLICATIONS

Tiebout, Marc; "A CMOS Direct Injection-Locked Oscillator Topology as High-Frequency Low-Power Frequency Divider", IEEE Journal of Solid-State Circuits, vol. 39, No. 7, Jul. 2004 (pp. 1170-1174).
Chuang et al, Y.-H.; "A Ring-Oscillator-Based Wide Locking Range Frequency Divider"; IEEE Microwave and Wireless Components Letters, vol. 16, No. 8, Aug. 2006 (pp. 470-472).

* cited by examiner

*Primary Examiner*—Robert Pascal
*Assistant Examiner*—James E Goodley
(74) *Attorney, Agent, or Firm*—Bacon & Thomas, PLLC

(57) ABSTRACT

An injection-locked frequency divider includes a ring oscillator, a signal injection circuit, a first adjustable load circuit and a second adjustable load circuit. The ring oscillator generates an oscillation signal according to a differential signal outputted by the signal injection circuit. According to an adjustable voltage, the first and second adjustable load circuits can respectively change equivalent impedances of the first adjustable load circuit and the second adjustable load circuit so that a free-running frequency of the oscillation signal of the ring oscillator is adjusted and an injection-locked frequency range of the injection-locked frequency divider is expanded.

9 Claims, 4 Drawing Sheets

INJECTION-LOCKED FREQUENCY DIVIDER

This application claims the benefit of Taiwan application Serial No. 96128307, filed Aug. 1, 2007, the subject matter of which is incorporated herein by reference.

BACKGROUND OF THE INVENTION

1. Field of the Invention

The invention relates in general to an injection-locked frequency divider, and more particularly to an injection-locked frequency divider with an adjustable injection-locked frequency range.

2. Description of the Related Art

In the highly developed electronic communication industry, a high-frequency frequency divider has played an indispensable role and has the functions of analyzing the frequency, generating an orthogonal signal and multiplex processing. The injection-locked frequency divider has the advantages of the high working frequency and the low power consumption, and is thus widely used in a radio frequency phase-locked loop circuit.

However, the conventional high-frequency frequency divider has an injection-locked frequency range which is too narrow. Although the injection-locked frequency range can be expanded by increasing the power of the injection signal, the power consumption is increased. Therefore, under the precondition of saving the power, it is an important target in the industry to design an injection-locked frequency divider having a wide injection-locked frequency range.

SUMMARY OF THE INVENTION

The invention is directed to an injection-locked frequency divider having an injection-locked frequency range, which can be adjusted by adjusting a resistance value of a load so that the injection-locked frequency range of the injection-locked frequency divider is expanded.

According to the present invention, an injection-locked frequency divider is provided. The injection-locked frequency divider includes a ring oscillator, a signal injection circuit, a first adjustable load circuit and a second adjustable load circuit. The ring oscillator includes a first delay cell and a second delay cell. Each of the first delay cell and the second delay cell comprises differential input terminals and differential output terminals. The differential input terminals and the differential output terminals of the first delay cell are respectively coupled to the differential output terminals and the differential input terminals of the second delay cell. The signal injection circuit inputs a first injection signal and a second injection signal to the differential input terminals of the first delay cell and the differential input terminals of the second delay cell, respectively. The first injection signal and the second injection signal are differential signals. The first adjustable load circuit and the second adjustable load circuit are respectively connected to and between the differential output terminals of the first delay cell and connected to and between the differential output terminals of the second delay cell, change equivalent impedances of the first adjustable load circuit and the second adjustable load circuit, change a free-running frequency of an oscillation signal of the ring oscillator in response to an adjustable voltage, and thus adjust an injection-locked frequency range of the injection-locked frequency divider. The first injection signal and the second injection signal are mixed with the oscillation signal so that a set of differential pair signals is outputted from the differential output terminals of each of the first and second delay cells, and a frequency of the set of differential pair signals is substantially equal to (1/N) times of a frequency of the first and second injection signals when the frequency of the first and second injection signals falls within an injection-locked frequency-divided range of the injection-locked frequency divider corresponding to N times of the free-running frequency, wherein N is a natural number greater than 1.

The invention will become apparent from the following detailed description of the preferred but non-limiting embodiments. The following description is made with reference to the accompanying drawings.

DETAILED DESCRIPTION OF THE INVENTION

In an injection-locked frequency divider of the invention, an injection-locked frequency range can be adjusted by adjusting an equivalent impedance of a load so that a wide injection-locked frequency range can be obtained.

Figure 1:
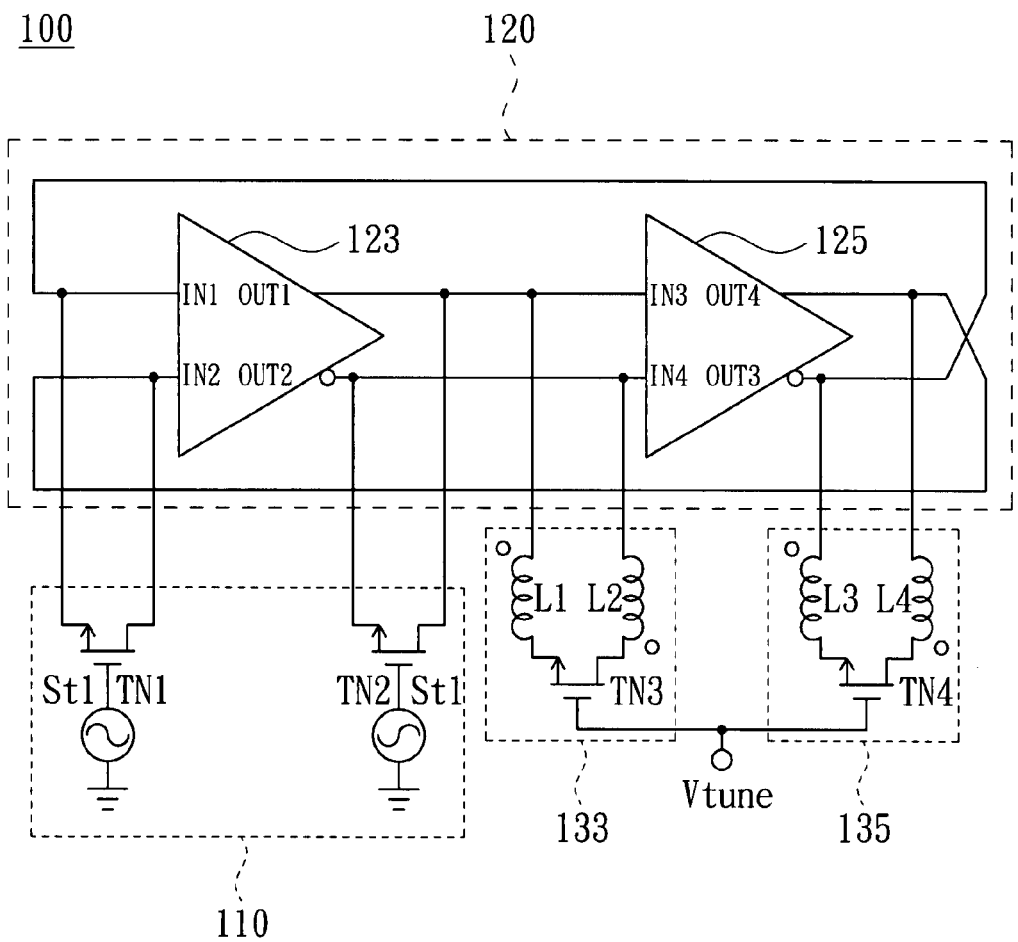
FIG. 1 is a schematic illustration showing a circuit of an injection-locked frequency divider according to a preferred embodiment of the invention.

FIG. 1 is a schematic illustration showing a circuit of an injection-locked frequency divider 100 according to a preferred embodiment of the invention. Referring to FIG. 1, the injection-locked frequency divider 100 includes a signal injection circuit 110, a ring oscillator 120, and adjustable load circuits 133 and 135. The ring oscillator 120 generates an oscillation signal according to a set of injection signals St2 and St2' inputted by the signal injection circuit 110. The adjustable load circuits 133 and 135 adjust a free-running frequency of this oscillation signal.

In FIG. 1, the ring oscillator 120 includes two stages of delay cells 123 and 125. The delay cell 123 has differential input terminals IN1 and IN2 and differential output terminals OUT1 and OUT2. The delay cell 125 has differential input terminals IN3 and IN4 and differential output terminals OUT3 and OUT4. The differential input terminals IN1 to IN4 are respectively coupled to the differential output terminals OUT3, OUT4, OUT1 and OUT2 to form the ring oscillator 120. The differential output terminals OUT1 and OUT2 output differential pair signals So1 and So2, and the differential output terminals OUT3 and OUT4 output differential pair signals So3 and So4.

The signal injection circuit 110 receives injection signals St1 and St1' outputted by signal sources 113 and 115 and thus outputs the injection signals St2 and St2'. Also, the signal injection circuit 110 injects the injection signal St2 to the differential input terminals IN1 and IN2 of the delay cell 123, and injects the injection signal St2' to the differential input terminals IN3 and IN4 of the delay cell 125. The injection signals St1 and St1' are differential signals, and the injection signals St2 and St2' are also differential signals having the frequency the same as that of the injection signals St1 and St1'.

In the embodiment of the invention, the signal injection circuit 110 includes transistors TN1 and TN2. The transistor TN1 has a drain and a source coupled to the differential input terminals IN1 and IN2 of the delay cell 123, and a gate for receiving the injection signal St1. The transistor TN2 has a drain and a source coupled to the differential input terminals IN4 and IN3 of the delay cell 125, and a gate for receiving the injection signal St1'.

When the injection signal St1 is high, the transistor TN1 turns on. Meanwhile, the injection signal St1' is low, and the transistor TN2 turns off. Similarly, when the injection signal St1 is low, the transistor TN1 turns off. Meanwhile, the injection signal St1' is high, and the transistor TN2 turns on. So, the transistors TN1 and TN2 switch with the frequency the same as that of the injection signals St1 and St1', and thus output the injection signals St2 and St2'. That is, the differential input terminals of the delay cells 123 and 125 are open-circuited and short-circuited with the frequency the same as that of the injection signals St1 and St1' so that the injection signals St2 and St2' are respectively injected to the delay cells 123 and 125.

The transistors TN1 and TN2 of this embodiment can be replaced with P-type metal oxidation semiconductor transistors, or can be respectively replaced with N-type and P-type metal oxidation semiconductor transistors. When the transistors TN1 and TN2 are respectively the N-type and P-type metal oxidation semiconductor transistors, the injection signals St2 and St2' can be generated according to only one of the injection signals St1 and St1'.

Thereafter, the injection signal St2 is mixed with the oscillation signals generated by the ring oscillator 120, and the set of the differential pair signals So1 and So2 is outputted from the differential output terminals OUT1 and OUT2 of the delay cell 123. Similarly, the injection signal St2' is mixed with the oscillation signals generated by the ring oscillator 120, and the set of the differential pair signals So3 and So4 is outputted from the differential output terminals OUT3 and OUT4 of the delay cell 125.

When the frequency of the injection signals St2 and St2' falls within an injection-locked frequency-divided range of the injection-locked frequency divider 100 corresponding to N times of the free-running frequency, the frequency of each of the differential pair signals So1 and So2 and the differential pair signals So3 and So4 is substantially equal to (1/N) times of the frequency of the injection signals St2 and St2', wherein N is a natural number greater than 1.

For example, when N is 2, that is, when the frequency of the injection signals St2 and St2' falls within the injection-locked frequency-divided range of the injection-locked frequency divider 100 corresponding to two times of the free-running frequency, the frequency of each of the differential pair signals So1 and So2 and the differential pair signals So3 and So4 is substantially equal to one half of the frequency of the injection signals St2 and St2'. That is, the injection-locked frequency divider 100 divides the frequency of the injection signals St2 and St2' by two.

In FIG. 1, the adjustable load circuit 133 is connected between the differential output terminals OUT1 and OUT2 of the delay cell 123, and the adjustable load circuit 135 is connected between the differential output terminals OUT3 and OUT4 of the delay cell 125. The adjustable load circuit 133 and the adjustable load circuit 135 change the equivalent impedances of the adjustable load circuit 133 and the adjustable load circuit 135 in response to an adjustable voltage $V_{tune}$, and thus change the free-running frequency of the oscillation signal of the ring oscillator 120, so as to adjust the injection-locked frequency range of the injection-locked frequency divider 100.

In the embodiment of the invention, the adjustable load circuit 133 includes inductors L1 and L2 and a transistor TN3. The inductor L1 has one terminal coupled to a source of the transistor TN3, and the other terminal coupled to the differential output terminal OUT1 of the delay cell 123. The transistor TN3 has a gate for receiving the adjustable voltage $V_{tune}$. The inductor L2 has one terminal coupled to a drain of the transistor TN3, and the other terminal coupled to the differential output terminal OUT2 of the delay cell 123.

In addition, the adjustable load circuit 135 includes inductors L3 and L4 and a transistor TN4. The inductor L3 has one terminal coupled to a source of the transistor TN4, and the other terminal coupled to the differential output terminal OUT3 of the delay cell 125. A gate of the transistor TN4 receives the adjustable voltage $V_{tune}$. The inductor L4 has one terminal coupled to a drain of the transistor TN4, and the other terminal coupled to the differential output terminal OUT4 of the delay cell 125.

The transistors TN3 and TN4 can be equivalent to an adjustable resistor. When the adjustable voltage $V_{tune}$ gradually increases, the equivalent resistance values between the drains and the sources of the transistors TN3 and TN4 also gradually decrease such that the equivalent impedances between the differential output terminals OUT1 and OUT2 and between the differential output terminals OUT3 and OUT4 decrease, and the free-running frequency of the oscillation signal of the ring oscillator 120 increases.

Consequently, the free-running frequency of the oscillation signal of the ring oscillator 120 can be adjusted by adjusting the adjustable voltage $V_{tune}$. Because the center of the injection-locked range of the injection-locked frequency divider 100 is located around the N times of the free-running frequency, the injection-locked frequency range also becomes very wide when the adjustable range of the free-running frequency is very wide.

Figure 2:
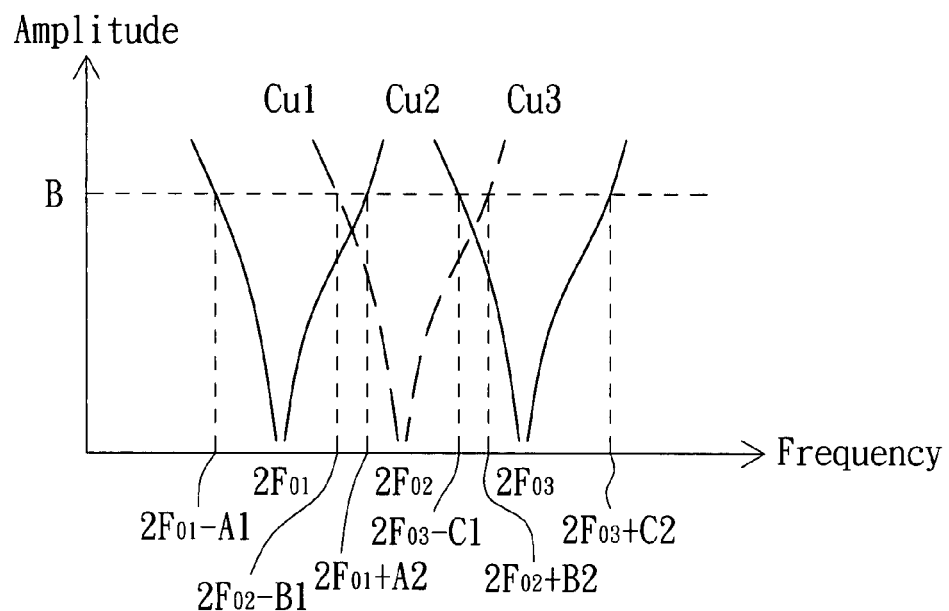
FIG. 2 shows an example of a curve representing a relationship between an amplitude and an injection-locked range of an injection signal in the injection-locked frequency divider according to the embodiment of the invention.

FIG. 2 shows an example of curves representing a relationship between an amplitude and an injection-locked range of an injection signal in the injection-locked frequency divider 100 according to the embodiment of the invention. As shown in FIG. 2, the curve Cu1 is a curve showing the relationship between the amplitude of the injection signal St2 and the injection-locked range of the injection-locked frequency divider 100 corresponding to two times of the free-running frequency $F_{O1}$ when the free-running frequency of the ring oscillator 120 is $F_{O1}$. For example, when the amplitude of the injection signal St2 is equal to B, the frequency of the differential pair signals outputted from the injection-locked frequency divider 100 is equal to one half of the frequency of the injection signal as long as the frequency of the injection signal St2 falls within $2F_{O1}-A1$ to $2F_{O1}+A2$. Thus, the injection-locked frequency divider 100 can divide the frequency of the injection signal St2 by two. That is, when the amplitude of the injection signal St2 is equal to B and the free-running frequency of the ring oscillator 120 is $F_{O1}$, the injection-locked range of the injection-locked frequency divider 100 ranges from $2F_{O1}-A1$ to $2F_{O1}+A2$.

Similarly, the curve Cu2 of FIG. 2 is a curve showing the relationship between the amplitude of the injection signal St2 and the injection-locked range of the injection-locked frequency divider 100 corresponding to two times of the free-running frequency $F_{O2}$ when the free-running frequency of the ring oscillator 120 is $F_{O2}$. The curve Cu3 is a curve showing the relationship between the amplitude of the injection signal St2 and the injection-locked range of the injection-locked frequency divider 100 corresponding to two times of the free-running frequency $F_{O3}$ when the free-running frequency of the ring oscillator 120 is $F_{O3}$.

When the amplitude of the injection signal St2 is equal to B and the free-running frequency of the ring oscillator 120 is $F_{O2}$, the injection-locked range of the injection-locked frequency divider 100 ranges from $2F_{O2}-B1$ to $2F_{O2}+B2$. When the amplitude of the injection signal St2 is equal to B and the free-running frequency of the ring oscillator 120 is $F_{O3}$, the injection-locked range of the injection-locked frequency divider 100 ranges from $2F_{O3}-C1$ to $2F_{O3}+C2$.

As shown in FIG. 2, adjusting the adjustable voltage $V_{tune}$ can obtain the free-running frequency of the ring oscillator 120 ranging from $F_{O1}$ to $F_{O3}$ so that the obtained injection-locked range of the injection-locked frequency divider 100 ranges from $2F_{O1}-A1$ to $2F_{O3}+C2$. Consequently, the injection-locked frequency divider according to the embodiment of the invention can obtain the wider injection-locked range by adjusting the free-running frequency of the ring oscillator.

Figure 3:
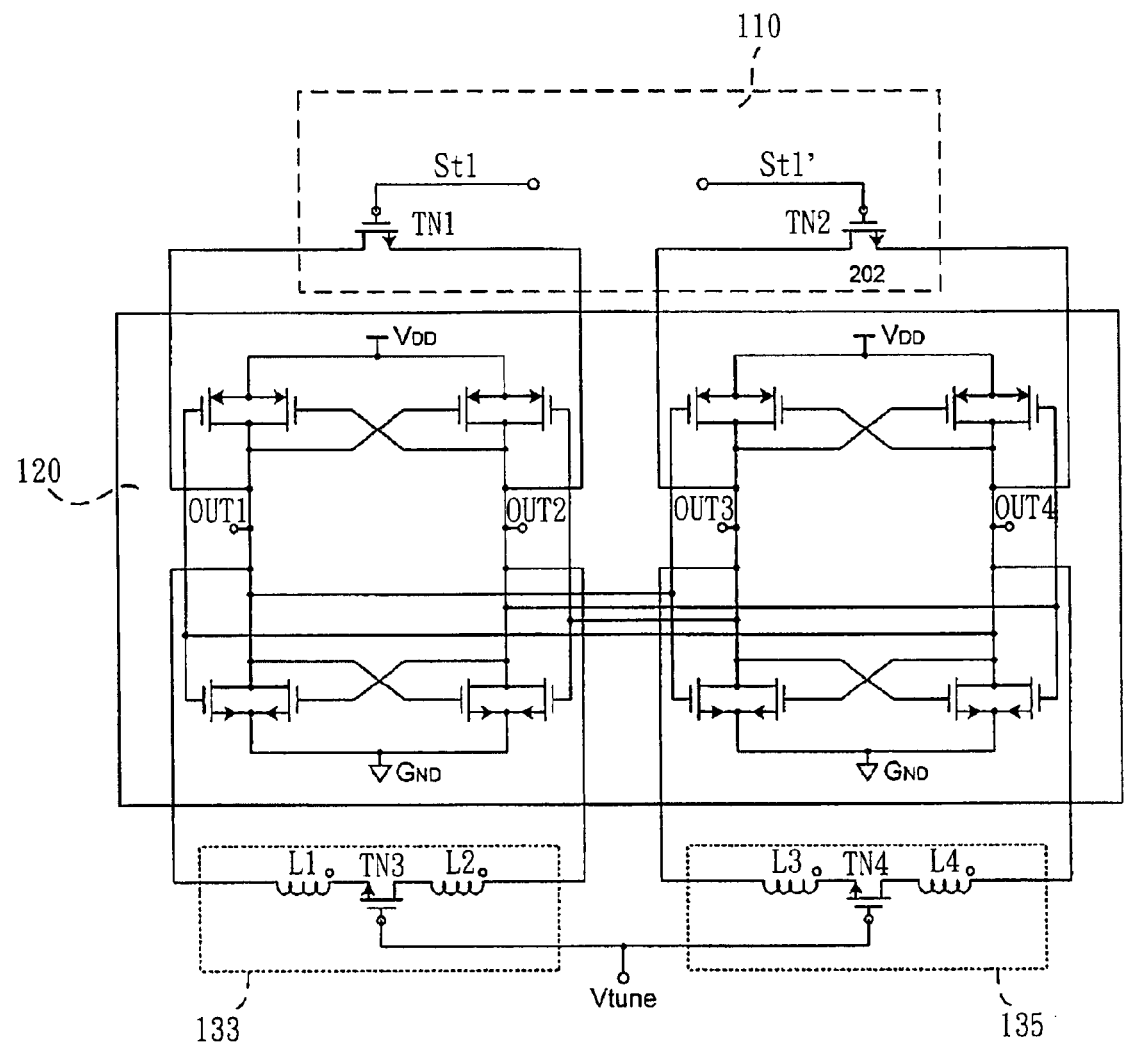
FIG. 3 is a schematic illustration showing a circuit of a ring oscillator according to the preferred embodiment of the invention.

FIG. 3 is a schematic illustration showing a circuit of a ring oscillator 150 according to the preferred embodiment of the invention. As shown in FIG. 3, the ring oscillator 150 can divide the injection signal St1 by 2, and then output the differential pair signals So1 and So2 having the frequency equal to one half that of the injection signal St1. Because the architecture and the operation of the ring oscillator 150 are well known to one of ordinary skill in the art, detailed descriptions thereof will be omitted.

Figure 4:
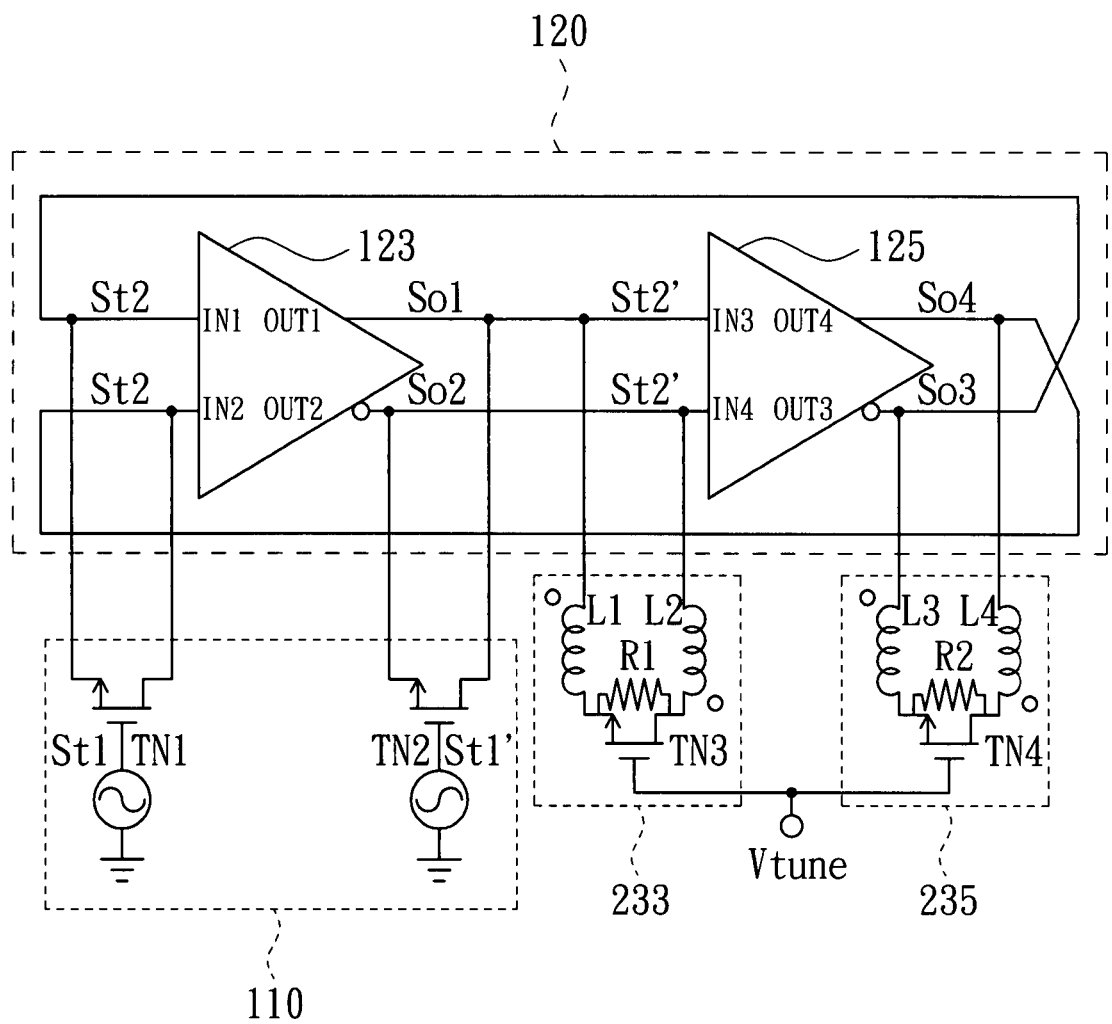
FIG. 4 is a circuit diagram showing an injection-locked frequency divider according to another embodiment of the invention.

FIG. 4 is a circuit diagram showing an injection-locked frequency divider 200 according to another embodiment of the invention. As shown in FIG. 4, what is different from the injection-locked frequency divider 100 of FIG. 1 is that an adjustable load circuit 233 of the injection-locked frequency divider 200 of this embodiment further includes a resistor R1 coupled between the drain and the source of the transistor TN3. In addition, an adjustable load circuit 235 thereof further includes a resistor R2 coupled between the drain and the source of the transistor TN4.

When the adjustable voltage $V_{tune}$ is lower than a threshold voltage of the transistor TN3 such that the transistor TN3 turns off, the inductors L1 and L2 and the resistor R1 are connected in series. Thus, the equivalent impedance of the adjustable load circuit 233 is determined to be one value. When the adjustable voltage $V_{tune}$ is higher than the threshold voltage of the transistor TN3 such that the transistor TN3 turns on, the resistor R1 and the equivalent resistor of the transistor TN3 are connected in parallel, and the resistor R1 and the inductors L1 and L2 are connected in series. Thus, the equivalent impedance of the adjustable load circuit 233 is determined as another value. Similarly, the adjustable load circuit 235 also changes its equivalent impedance in the same manner.

Consequently, changing the adjustable voltage $V_{tune}$ and controlling on/off states of the transistors TN3 and TN4 can change the equivalent impedances of the adjustable load circuits 233 and 235 and thus adjust the free-running frequency of the oscillation signal of the ring oscillator 120.

The injection-locked frequency divider 200 of this embodiment changes the value of the free-running frequency of the oscillation signal of the ring oscillator 120 by adjusting the adjustable voltage $V_{tune}$ so that the wider injection-locked frequency range can be obtained.

Figure 5:
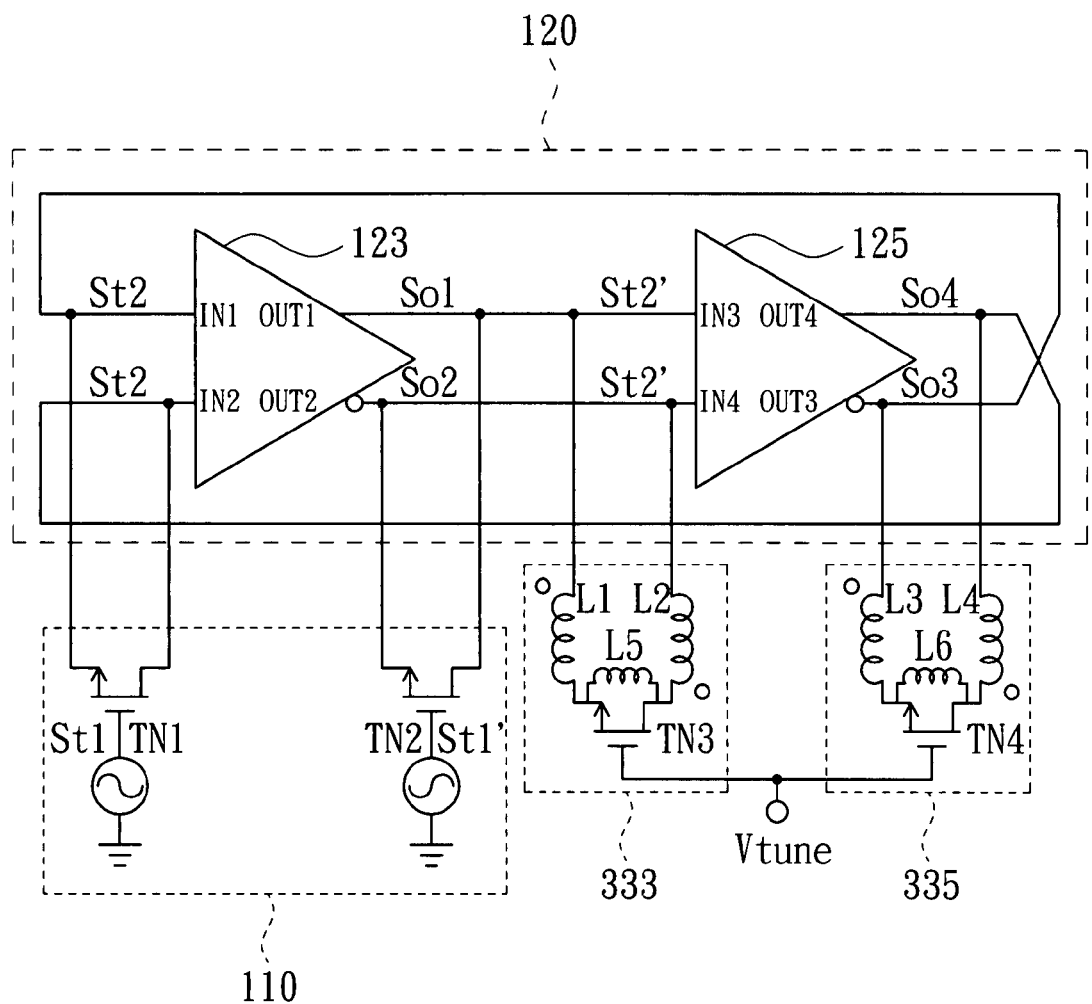
FIG. 5 is a circuit diagram showing an injection-locked frequency divider according to still another embodiment of the invention.

FIG. 5 is a circuit diagram showing an injection-locked frequency divider 300 according to still another embodiment of the invention. As shown in FIG. 5, what is different from the injection-locked frequency divider 100 of FIG. 1 is that an adjustable load circuit 333 of the injection-locked frequency divider 300 further includes an inductor L5 coupled between the drain and the source of the transistor TN3, and an adjustable load circuit 335 thereof further includes an inductor L6 coupled between the drain and the source of the transistor TN4.

When the adjustable voltage $V_{tune}$ is lower than the threshold voltage of the transistor TN3 such that the transistor TN3 turns off, the inductors L1 and L2 and the inductor L5 are connected in series. Thus, the equivalent impedance of the adjustable load circuit 333 can be determined as one value. When the adjustable voltage $V_{tune}$ is higher than the threshold voltage of the transistor TN3 such that the transistor TN3 turns on, the inductor L5 and the equivalent resistor of the transistor TN3 are connected in parallel, and the inductor L5, L1 and L2 are connected in series. Thus, the equivalent impedance of the adjustable load circuit 333 is determined as another value. Similarly, the adjustable load circuit 335 also changes its equivalent impedance in the same manner.

Consequently, changing the adjustable voltage $V_{tune}$ and controlling on/off states of the transistors TN3 and TN4 can change the equivalent impedances of the adjustable load circuits 333 and 335 so that the free-running frequency of the oscillation signal of the ring oscillator 120 is adjusted.

In the above-mentioned embodiments, the circuit operation of the injection-locked frequency divider 100 is illustrated by taking the transistors TN1 to TN4 being N-type metal oxidation semiconductor transistors as an example. However, the invention is not limited thereto. In other embodiments of the invention, the transistors TN1 to TN4 can be P-type metal oxidation semiconductor transistors simultaneously.

The injection-locked frequency divider 300 of this embodiment changes the free-running frequency of the oscillation signal of the ring oscillator 120 by adjusting the adjustable voltage $V_{tune}$ so that the wider injection-locked frequency range can be obtained similarly.

The injection-locked frequency divider according to each embodiment of the invention is disposed on a chip and thus may be widely applied to small electronic devices with the reduced cost. In addition, the injection-locked frequency divider of the invention can adjust the free-running frequency of the ring oscillator and thus obtain the wider injection-locked range using the adjustable inductor load circuit to change the equivalent impedance of the output load of the ring oscillator.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An injection-locked frequency divider, comprising:
    a ring oscillator, which comprises a first delay cell and a second delay cell, wherein each of the first delay cell and the second delay cell comprises differential input terminals and differential output terminals and the differential input terminals and the differential output terminals of the first delay cell are respectively coupled to the differential output terminals and the differential input terminals of the second delay cell;
    a signal injection circuit for injecting a first injection signal and a second injection signal to the differential input terminals of the first delay cell and the differential input terminals of the second delay cell, respectively, wherein the first injection signal and the second injection signal are differential signals; and a first adjustable load circuit and a second adjustable load circuit, which are respectively connected between the differential output terminals of the first delay cell and connected between the differential output terminals of the second delay cell, change equivalent impedances of the first adjustable load circuit and the second adjustable load circuit, so as to change a free-running frequency of an oscillation signal of the ring oscillator in response to an adjustable voltage, and thus adjust an injection-locked frequency range of the injection-locked frequency divider, wherein the first adjustable load circuit comprises a first inductor, a second inductor and a first transistor, and the first transistor has a control terminal for receiving the adjustable voltage, a first terminal coupled to a first terminal of the differential output terminals of the first delay cell via the first inductor, and a second terminal coupled to a second terminal of the differential output terminals of the first delay cell via the second inductor;

wherein the adjustable voltage is a continuously adjustable analog voltage; and wherein the first injection signal and the second injection signal are mixed with the oscillation signal so that a set of differential pair signals is outputted from the differential output terminals of each of the first and second delay cells, and a frequency of the set of differential pair signals is substantially equal to (I/N) times of a frequency of the first and second injection signals when the frequency of the first and second injection signals falls within an injection-locked frequency-divided range, which corresponds to N times of the free-running frequency, of the injection-locked frequency divider, wherein N is a natural number greater than 1.

2. The frequency divider according to claim 1, wherein the first adjustable load circuit further comprises a first resistor coupled between the first terminal and the second terminal of the first transistor.

3. The frequency divider according to claim 1, wherein the first adjustable load circuit further comprises a fifth inductor coupled between the first terminal and the second terminal of the first transistor.

4. The frequency divider according to claim 1, wherein the second adjustable load circuit comprises a third inductor, a fourth inductor and a second transistor, and the second transistor has a control terminal for receiving the adjustable voltage, a first terminal coupled to a first terminal of the differential output terminals of the second delay cell via the third inductor, and a second terminal coupled to a second terminal of the differential output terminals of the second delay cell via the fourth inductor.

5. The frequency divider according to claim 4, wherein the second adjustable load circuit further comprises a second resistor coupled between the first terminal and the second terminal of the second transistor.

6. The frequency divider according to claim 4, wherein the second adjustable load circuit further comprises a sixth inductor coupled between the first terminal and the second terminal of the second transistor.

7. The frequency divider according to claim 1, wherein the signal injection circuit comprises a third transistor and a fourth transistor, the third and fourth transistors simultaneously pertain to one of an N-type metal oxidation semiconductor transistor and a P-type metal oxidation semiconductor transistor, a first terminal and a second terminal of the third transistor are coupled to the differential input terminals of the first delay cell, a first terminal and a second terminal of the fourth transistor are coupled to the differential input terminals of the second delay cell, and control terminals of the third transistor and the fourth transistor respectively receive a third injection signal and a fourth injection signal, and thus output the first and second injection signals corresponding to the third injection signal and the fourth injection signal.

8. The frequency divider according to claim 1, wherein the signal injection circuit comprises a third transistor and a fourth transistor, the third and fourth transistors respectively pertain to an N-type metal oxidation semiconductor transistor and a P-type metal oxidation semiconductor transistor or the P-type metal oxidation semiconductor transistor and the N-type metal oxidation semiconductor transistor, a first terminal and a second terminal of the third transistor are coupled to the differential input terminals of the first delay cell, a first terminal and a second terminal of the fourth transistor are coupled to the differential input terminals of the second delay cell, and control terminals of the third transistor and the fourth transistor receive a injection signal and, respectively, output the first and second injection signals corresponding to the injection signal.

9. The frequency divider according to claim 1 being disposed in a chip.

* * * * *